United States Patent
Yang et al.

(10) Patent No.: US 10,964,636 B2
(45) Date of Patent: Mar. 30, 2021

(54) INTERCONNECT STRUCTURE WITH LOW RESISTIVITY AND METHOD FOR FORMING THE SAME

(71) Applicant: Taiwan Semiconductor Manufacturing Co., Ltd., Hsinchu (TW)

(72) Inventors: Shin-Yi Yang, New Taipei (TW); Ming-Han Lee, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/135,088

(22) Filed: Sep. 19, 2018

(65) Prior Publication Data

US 2020/0091055 A1    Mar. 19, 2020

(51) Int. Cl.
*H01L 23/498* (2006.01)
*H01L 21/768* (2006.01)
*H01L 23/532* (2006.01)

(52) U.S. Cl.
CPC .. *H01L 23/49827* (2013.01); *H01L 21/76802* (2013.01); *H01L 21/76843* (2013.01); *H01L 23/49838* (2013.01); *H01L 23/53238* (2013.01); *H01L 23/53266* (2013.01)

(58) Field of Classification Search
CPC ......... H01L 23/49827; H01L 21/76843; H01L 21/76802; H01L 23/49838; H01L 23/53266; H01L 21/76879; H01L 21/76829; H01L 21/76816; H01L 23/53223; H01L 23/53238; H01L 23/5329; H01L 21/76849; H01L 21/76897; H01L 23/53295; H01L 21/76805; H01L 23/528; H01L 21/76844; H01L 21/76834; H01L 23/5226; H01L 23/53228; H01L 21/76832; H01L 21/76846; H01L 23/5283; H01L 21/76804; H01L 2924/0002; H01L 21/76807; C23F 1/44; C23F 4/00
See application file for complete search history.

(56) References Cited

U.S. PATENT DOCUMENTS

| | | | | |
|---|---|---|---|---|
| 6,008,140 A | * | 12/1999 | Ye | ............... C23F 4/00 216/75 |
| 6,548,905 B2 | * | 4/2003 | Park | ........... H01L 21/76805 257/748 |
| 7,517,736 B2 | * | 4/2009 | Mehta | ......... H01L 21/76802 257/E21.575 |

(Continued)

*Primary Examiner* — Stephen W Smoot
*Assistant Examiner* — Vicki B. Booker
(74) *Attorney, Agent, or Firm* — McClure, Qualey & Rodack, LLP

(57) ABSTRACT

A method for forming a semiconductor device structure is provided. The method includes forming a first conductive feature over a substrate. The method also includes forming an insulating layer over the substrate and covering the first conductive feature. The method also includes forming a first opening in the insulating layer to expose the first conductive feature. The method also includes recessing the exposed first conductive feature through the first opening, so as to form a second opening in the first conductive feature and below the first opening. The method also includes filling the first opening and the second opening with a second conductive feature.

20 Claims, 9 Drawing Sheets

(56) References Cited

U.S. PATENT DOCUMENTS

| | | | |
|---|---|---|---|
| 2003/0218256 A1* | 11/2003 | Merchant | H01L 21/76807 257/774 |
| 2007/0235684 A1* | 10/2007 | Mistkawi | C09K 13/08 252/79.1 |
| 2010/0013060 A1* | 1/2010 | Lamy | H01L 21/76898 257/621 |
| 2017/0263547 A1* | 9/2017 | Adusumilli | H01L 21/76843 |

* cited by examiner

INTERCONNECT STRUCTURE WITH LOW RESISTIVITY AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density has generally increased while geometric size (i.e., the smallest component (or line) that can be created through a fabrication process) has decreased.

As the semiconductor industry has progressed into nanometer technology process nodes in pursuit of higher device density, higher performance, and lower costs, the demands for scaling down have increased the complexity of processing and manufacturing semiconductor devices for ICs. Since fabrication processes continue to become more difficult to perform, it is a challenge to form reliable semiconductor devices at smaller and smaller sizes.

Although existing methods for fabricating IC devices have been generally adequate for their intended purposes, they have not been entirely satisfactory in every respect. Improved techniques for fabricating IC devices may relax existing design rules, overcome existing limitations, and thereby enable even more robust circuit devices to be manufactured.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1H-1 is a cross-sectional view of a semiconductor device structure, in accordance with some embodiments

DETAILED DESCRIPTION

Figure 1A:
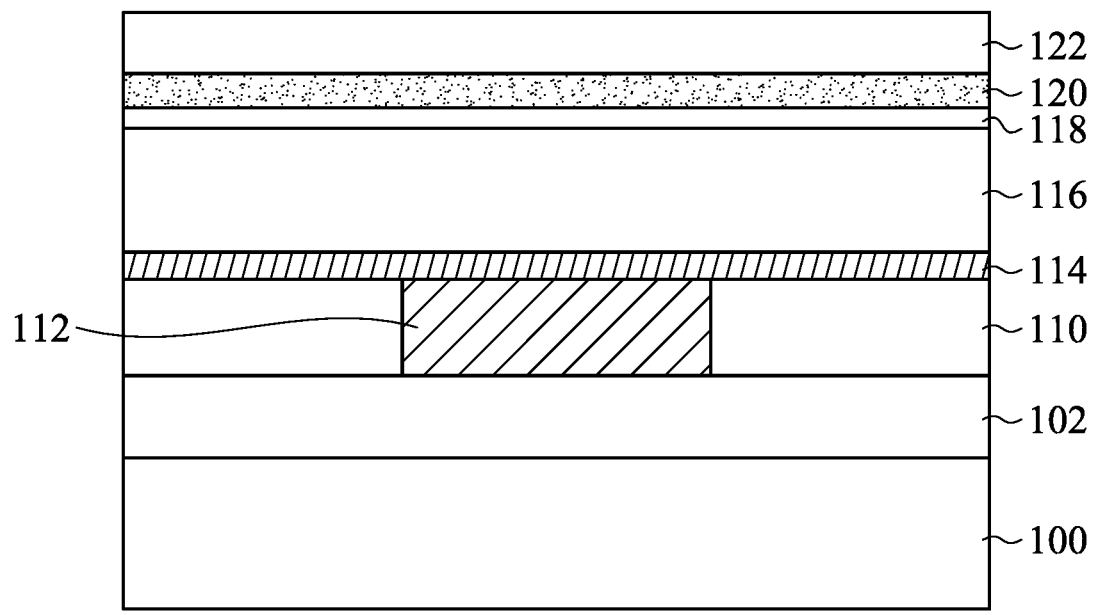
FIGS. 1A to 1H are cross-sectional views of various intermediate stages of a method of forming the semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments for forming a semiconductor device structure are provided. A first conductive feature is covered by an insulating layer. A first opening is formed in the insulating layer to expose the first conductive feature. Afterwards, the exposed first conductive feature is recessed, so as to form a second opening (e.g., a recess) in the first conductive feature and below the first opening. A second conductive feature is filled into the first opening and the second opening. Since the recess in the first conductive feature increases the contact area between the first conductive feature and the second conductive feature, the contact resistance between the first conductive feature and the second conductive feature is reduced.

Embodiments of a semiconductor device structure and a method for forming a semiconductor device structure are provided. FIGS. 1A to 1H are cross-sectional views of various intermediate stages of a method of forming the semiconductor device structure in accordance with some embodiments. A semiconductor substrate 100 is provided, as shown in FIG. 1A in accordance with some embodiments. In some embodiments, the semiconductor substrate 100 is a bulk semiconductor substrate, such as a semiconductor wafer. The semiconductor substrate 100 may include silicon or another elementary semiconductor material such as germanium. For example, the semiconductor substrate 100 is a silicon wafer.

Alternatively, the semiconductor substrate 100 includes a compound semiconductor. The compound semiconductor may include silicon germanium, gallium arsenide, silicon carbide, indium arsenide, indium phosphide, another suitable compound semiconductor, or a combination thereof. In some other embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 100. The device elements are not shown in figures for the purpose of simplicity and clarity. Examples of the various device elements include transistors, diodes, another suitable element, or a combination thereof. For example, the transistors may be metal oxide semiconductor field effect transistors (MOS- FET), complementary metal oxide semiconductor (CMOS) transistors, bipolar junction transistors (BJT), high-voltage transistors, high-frequency transistors, p-channel and/or n channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

In some embodiments, an interconnection structure (which will be described in more detail later) is formed over the semiconductor substrate 100. The interconnection structure includes multiple dielectric layers containing an inter-layer dielectric (ILD) layer and one or more inter-metal dielectric (IMD) layers. The interconnection structure also includes multiple conductive features formed in the ILD and IMD layers. The conductive features may include conductive layers and conductive vias/contacts. Various processes, such as back-end-of-line (BEOL) semiconductor fabrication processes, are performed to form the interconnection structure.

An insulating layer 102 is formed over the semiconductor substrate 100, in accordance with some embodiments. The insulating layer 102 may serve as an ILD or IMD layer. The insulating layer 102 covers device elements formed in and/or over the semiconductor substrate 100. The insulating layer 102 may be a single layer or a multi-layer structure including dielectric sub-layers. In some embodiments, the insulating layer 102 is made of or includes a low dielectric constant (low-k) material, an extreme low-k (ELK) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. In some embodiments, the insulating layer 102 is deposited using a chemical vapor deposition (CVD) process, a spin-on process, a spray coating process, or other applicable processes, or a combination thereof. The low-k or ELK material may have a lower dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. The use of the low-k or ELK material as the insulating layer 102 is helpful for reducing the resistance capacitance (RC) delay.

In some other embodiments, the insulating layer 102 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric, one or more other suitable materials, or a combination thereof.

In some embodiments, multiple conductive features (not shown) are formed in the dielectric layer 102, so as to be electrically connected between the device elements. In some embodiments, such conductive features are made of or include Cu, Al, W, Ti, Co, Ni, Au, Pt, one or more other suitable materials, or a combination thereof. Various processes, including deposition, etching, planarization, or the like, may be used to form the conductive features in the dielectric layer 102.

An insulating layer 110 is formed over the insulating layer 102, in accordance with some embodiments. The insulating layer 110 may serve as an IMD layer. The insulating layer 110 may be a single layer or a multi-layer structure including dielectric sub-layers. In some embodiments, the materials and/or formation methods of the insulating layer 110 are the same as or similar to those of the insulating layer 102.

In some embodiments, multiple conductive features may be formed in the insulating layer 110. In order to simplify the diagram, only a conductive feature 112 is depicted in FIG. 1A. It should be noted that the dimensions of the conductive feature 112 shown in FIG. 1A is only an example. The conductive feature 112 may be conductive layers (e.g., metal layers) or other suitable conductive features. In some embodiments, the conductive feature 112 is single or dual damascene structures and is electrically connected to the device elements through the conductive features in the underlying insulating layer 102. In some embodiments, the conductive feature 112 is a single layer or a multi-layer structure. For example, the conductive feature 112 is a multi-layer structure including a diffusion barrier liner, a seed layer, a fill metal material layer, one or more other suitable layers, or a combination thereof. In some embodiments, the conductive feature 112 is a metal layer that comprises Cu, Co, Ni, Ru, W, Mo, or Mn.

An etching stop layer 114 is formed over the insulating layer 110 and covering the conductive feature 112, in accordance with some embodiments. The etching stop layer 114 is used to protect the conductive features 112 from being damaged during subsequent etching processes. In some embodiments, the etching stop layer 114 is made of or includes silicon nitride (SiN), silicon oxynitride (SiON), silicon carbide (SiC), silicon carbonitride (SiCN), silicon oxycarbide (SiCO), one or more other suitable materials, or a combination thereof. In some embodiments, the etching stop layer 140 is formed by a deposition process, such as a CVD process, a spin-on process, one or more other suitable materials, or a combination thereof. In some other embodiments, the etching stop layer 114 is not formed.

An insulating layer 116 is formed over the etching stop layer 114, in accordance with some embodiments. The insulating layer 116 also serves as an IMD layer. In some embodiments, the materials and/or formation methods of the insulating layer 116 are the same as or similar to those of the insulating layers 102 and 110.

A tri-layer resist structure is formed over the insulating layer 116, in accordance with some embodiments of the disclosure. In some embodiments, the tri-layer resist structure includes a bottom layer 118, a middle layer 120 and a top layer 122. The bottom layer 118 is a first layer of the tri-layer resist structure. The bottom layer 118 may contain a material that is patternable and/or have anti-reflection properties. In some embodiments, the bottom layer 118 is a bottom anti-reflective coating (BARC) layer, such as a nitrogen-free anti-reflective coating (NFARC) layer. In some embodiments, the bottom layer 118 is formed by a spin-on coating process, a chemical vapor deposition (CVD) process, a physical vapor deposition (PVD) process, or another suitable deposition process.

The middle layer 120 is formed over the bottom layer 118 and is a second layer of the tri-layer resist structure. The middle layer 120 (which is also referred to as a hard mask layer) provides anti-reflective properties and/or hard mask properties for the photolithography process. In addition, the middle layer 120 is designed to provide etching selectivity from the bottom layer 118 and the top layer 122. In some embodiments, the middle layer 120 is made of silicon nitride, silicon oxynitride or silicon oxide and is formed by a spin-on coating process, a CVD process, a PVD process, or another suitable deposition process.

The top layer 122 is formed over the middle layer 120 and is a third layer of the tri-layer resist structure. The top layer 122 may be positive photoresist or negative photoresist. In some other embodiments, the tri-layer resist structure includes oxide-nitride-oxide (ONO) layers.

Figure 1B:
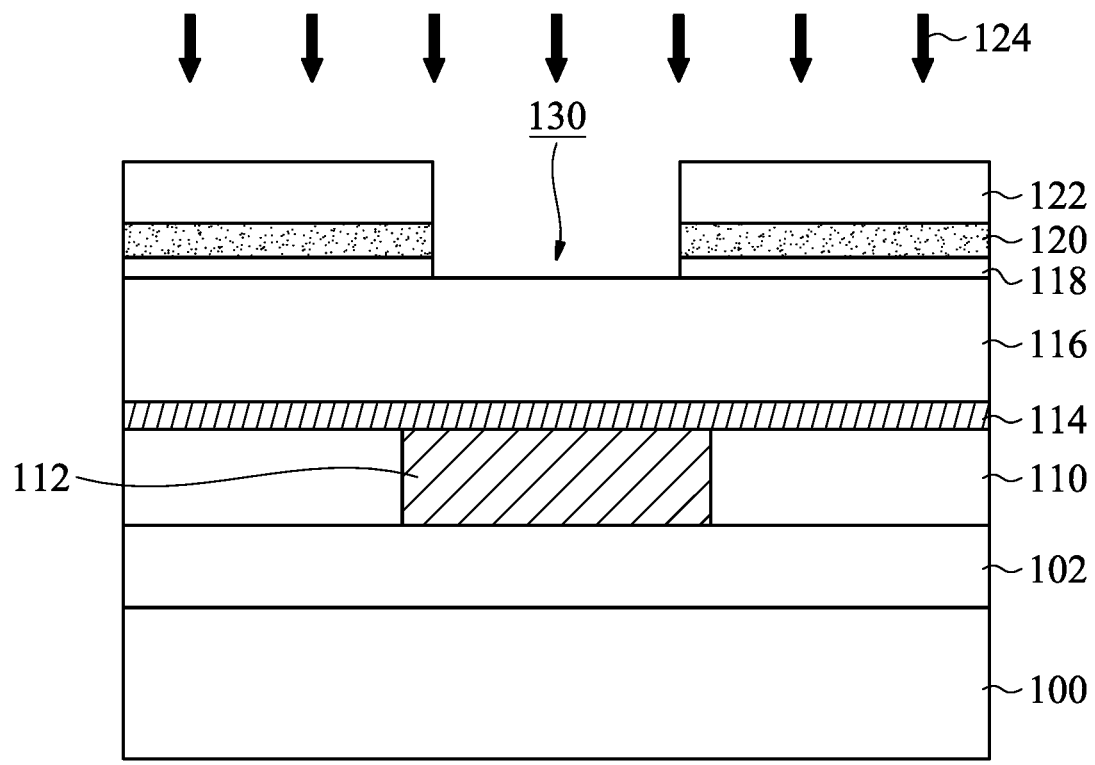

After the tri-layer resist structure is formed, the top layer 122 is patterned by a photolithography process, as shown in FIG. 1B in accordance with some embodiments. The patterned top layer 122 has a trench pattern (which will subsequently be formed in the insulating layer 116) to expose the middle layer 120. Afterwards, one or more etching processes 124 (such as a dry etching process and/or a wet etching process) are performed on the exposed middle layer 120 and the underlying bottom layer 118, in accordance with some embodiments. The exposed middle layer 120 and the underlying bottom layer 118 are partially etched so that an opening 130 is formed therein, as shown in FIG. 1B. As a result, the trench pattern in the patterned top layer 122 is transferred into the middle layer 120 and the bottom layer 118 and the underlying insulating layer 116 is exposed.

Figure 1C:
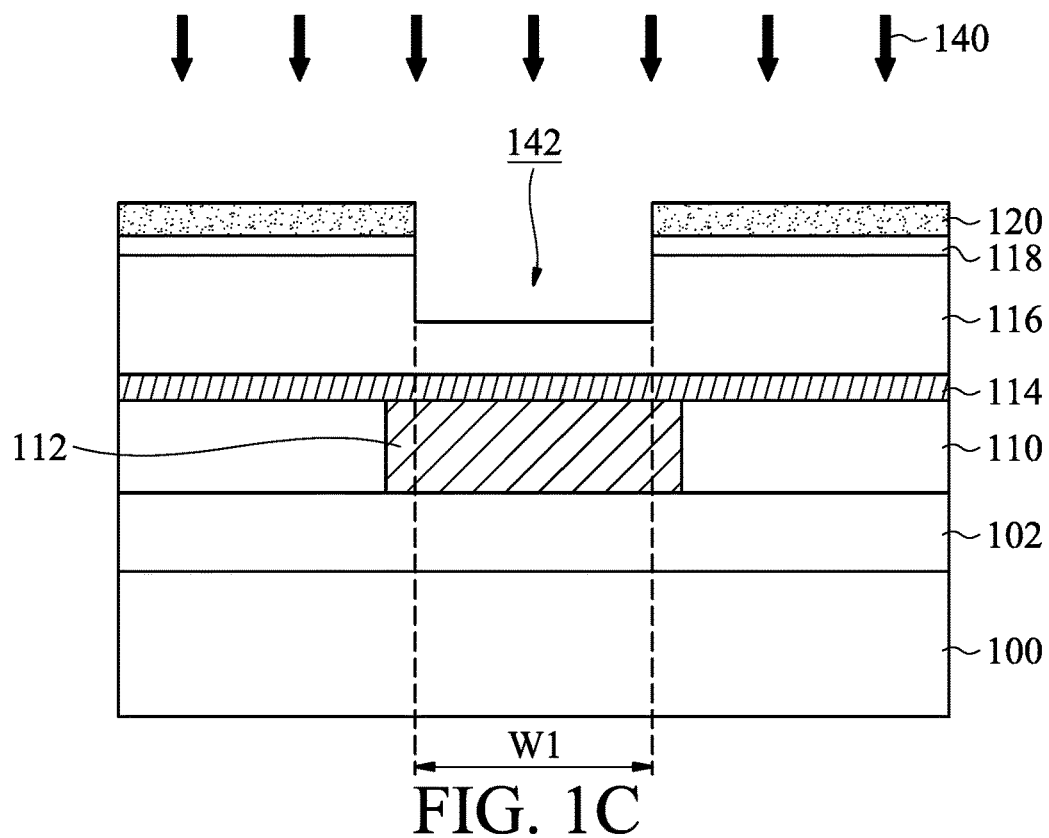

After the opening 130 is formed, an etching process 140 is performed on the exposed insulating layer 116, as shown in FIG. 1C in accordance with some embodiments. As a result, the exposed insulating layer 116 is partially etched and patterned so that a trench opening 142 is formed. The etching process 140 may be a dry etching process or a wet etching process. The top layer 122 may be removed or stripped before, during or after the etching process 140 for forming the trench opening 142. The trench opening 142 extends in the insulating layer 116 without penetrating through the insulating layer 116.

Figure 1D:
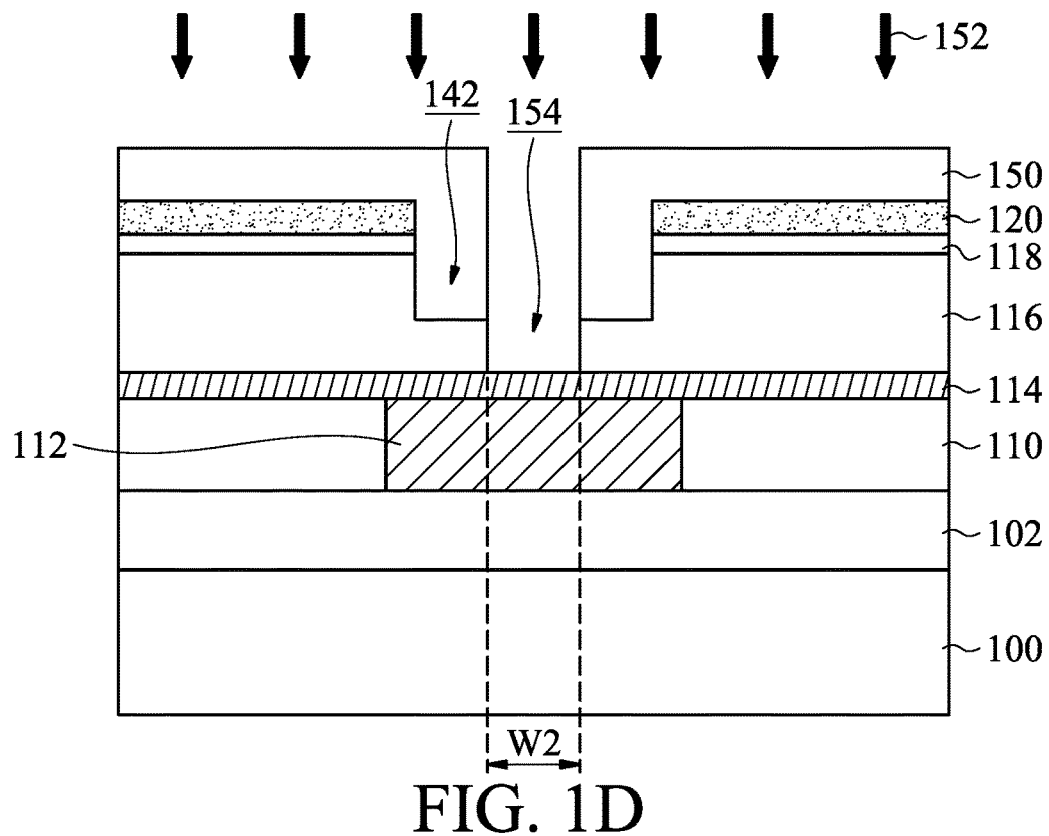

In some embodiments, the trench opening 142 has substantially vertical sidewalls that define a trench width W1, as shown in FIG. 1D. In some other embodiments, the trench opening 142 has inclined sidewalls (not shown) that define a top trench width W1 (not shown).

After the trench opening 142 is formed, a patterned masking layer 150 is formed over the middle layer 120 and fills in the trench opening 142, as shown in FIG. 1D in accordance with some embodiments. The patterned masking layer 150 exposes a portion of the insulating layer 116 on the bottom of the trench opening 142 and defines a via pattern, which will subsequently be formed in the insulating layer 116 below the trench opening 142. The materials and/or formation methods of the masking layer 150 are the same as or similar to those of the top layer 122 (shown in FIGS. 1A and 1B).

Afterwards, an etching process 152 is performed on the exposed insulating layer 116 on the bottom of the trench opening 142, in accordance with some embodiments. The insulating layer 116 is etched and patterned so that a via opening 154 is formed, as shown in FIG. 1D. The etching process 152 may be a dry etching process or a wet etching process. During the etching process 152, the etching stop layer 114 protects the conductive feature 112 from being damaged.

The via opening 154 extends from the trench opening 142 and penetrates through the insulating layer 116 so that the etching stop layer 114 is exposed from the via opening 154. In some embodiments, the via opening 154 has substantially vertical sidewalls that define a via bottom width W2. The via opening 154 and the trench opening 142 may have different widths. For example, the via bottom width W2 of the via opening 154 may be narrower than the width W1 of the trench opening 142.

The profile of the via opening 154, as viewed from a top-view perspective may be circular, rectangular, square, or another desired shape. In some other embodiments, the via opening 154 has inclined sidewalls (not shown) that define a top via bottom width W2 (not shown) and a bottom via bottom width (not shown) that is narrower than the top via bottom width W2.

Figure 1E:
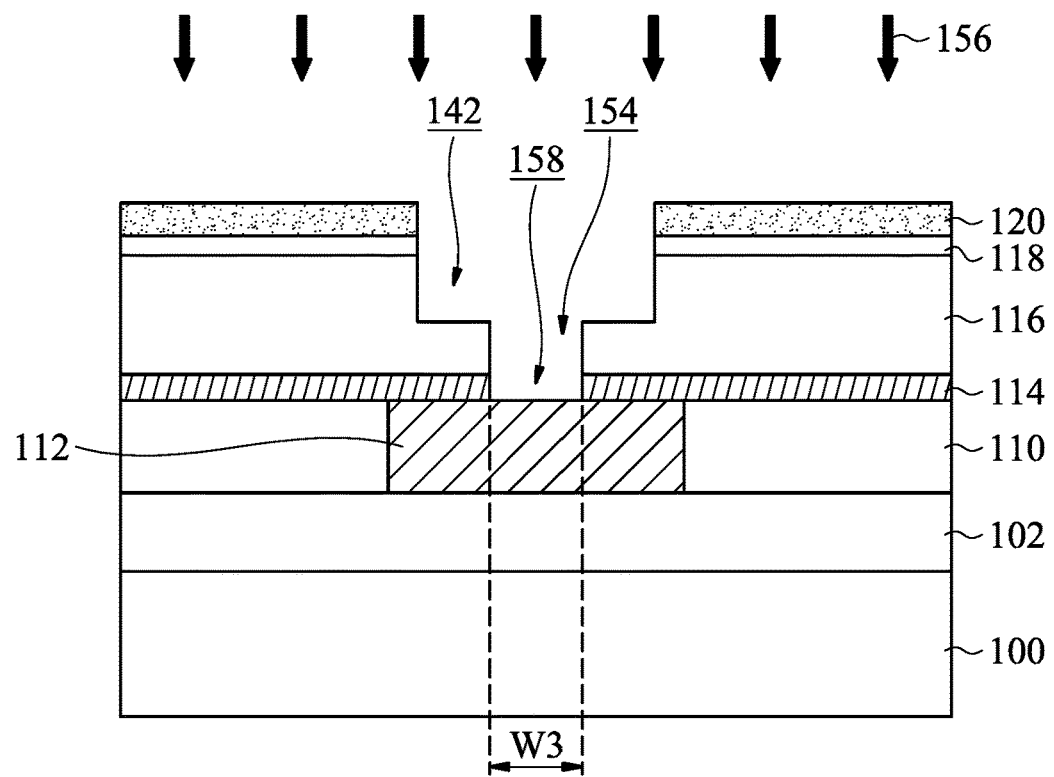

After the via opening 154 is formed, the masking layer 150 is removed or stripped, as shown in FIG. 1E in accordance with some embodiments. Afterwards, in some embodiments, the exposed etching stop layer 114 below the via opening 154 is removed by performing an etching process 156. As a result, an extended via opening 158 is formed in the etching stop layer 140 so that the conductive feature 112 is exposed from the extended via opening 158, the via opening 154 and the trench opening 142 (which form a dual damascene opening), as shown in FIG. 1E. The etching process 156 may include a dry etching process or a wet etching process.

Similarly, the extended via opening 158 extends from the via opening 154 and penetrates through the etching stop layer 114 so that the conductive feature 112 is exposed from the extended via opening 158. The extended via opening 158 has substantially vertical sidewalls that define a via bottom width W3. In some embodiments, the vertical sidewalls of the extended via opening 158 are substantially aligned with the corresponding vertical sidewalls of the via opening 154. The via opening 154 and the extended via opening 158 may have substantially the same widths. For example, the via bottom width W2 of the via opening 154 may be substantially the same as the via bottom width W3 of the extended via opening 158.

Figure 1F:
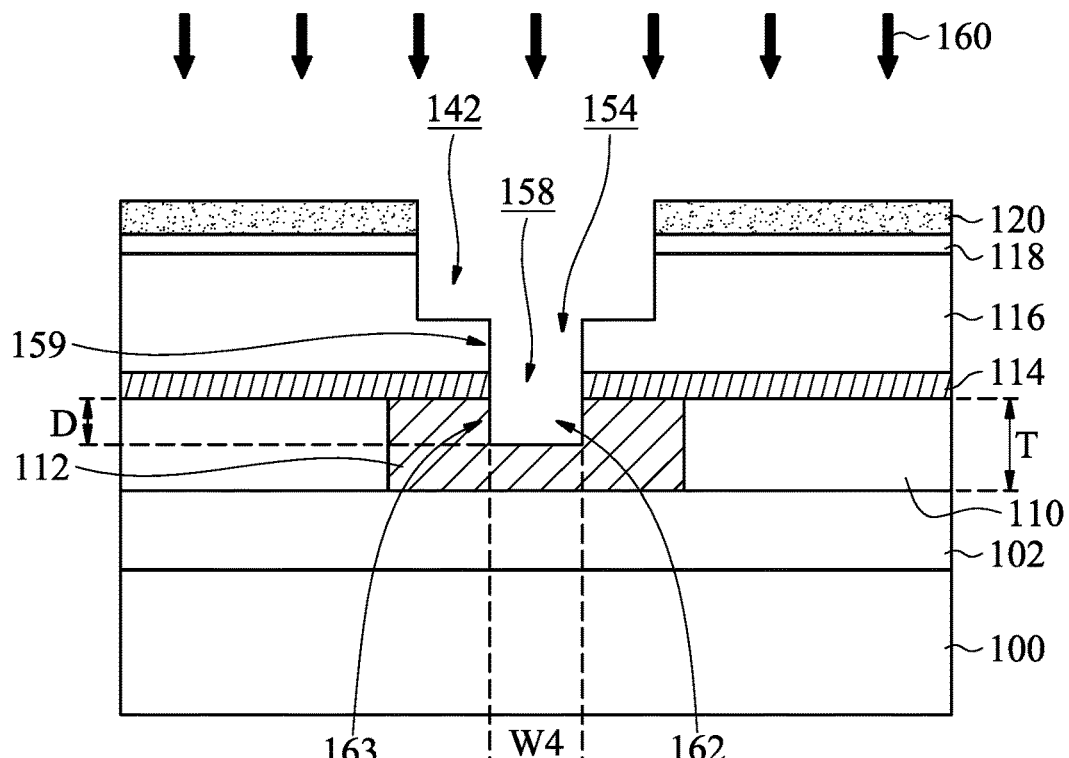

After the extended via opening 158 is formed to expose the conductive feature 112, the exposed conductive feature 112 is recessed, as shown in FIG. 1F in accordance with some embodiments. In some embodiments, an etching process 160 is performed on the exposed conductive feature 112 so that the exposed conductive feature 112 below the extended via opening 158 is partially removed. As a result, a recess (or opening) 162 is formed in the conductive feature 112 so that the dual damascene opening (which includes the openings 142, 154 and 158) is extended into the conductive feature 112 via the recess 162, as shown in FIG. 1F.

In some embodiments, the recess 162 has substantially vertical sidewalls 163 that define a recess width W4. Moreover, the vertical sidewalls 163 of the recess 162 are substantially aligned with the corresponding vertical sidewalls 159 of the via opening 154 and the extended via opening 158, as shown in FIG. 1F. As a result, the recess 162 and the extended via opening 158 have substantially the same widths. For example, the via bottom width W3 of the extended via opening 158 may be substantially the same as the recess width W4 of the recess 162. In some other embodiments, the via opening 154 shown in FIG. 1D has tapered sidewalls (not shown) that define a via bottom width and a via top width greater than the via bottom width. Moreover, the extended via opening 158 extending from the via opening 154, as shown in FIG. 1E, also has tapered sidewalls (not shown) that define a via bottom width and a via top width greater than the via bottom width and substantially the same as the via bottom width of the via opening 154 with tapered sidewalls. In those cases, the recess 162 having substantially vertical sidewalls 163 are not aligned with the corresponding sidewalls of the via opening 154 and the extended via opening 158. As a result, the recess width W4 of the recess 162 is substantially the same as the via bottom width of the extended via opening 158.

In some embodiments, the recess 162 has a depth D in a range from about 10 Å to about 50 Å. In some embodiments, the depth D is that is not greater than 30% of a thickness T of the conductive feature 112. In some embodiments, the depth D is in a range from about 5% to about 30% of a thickness T of the conductive feature 112. The sufficient depth of the recess 162 is designed to effectively increase contact area between the conductive feature 112 and the subsequently formed conductive feature that is in contact with the conductive feature 112 while maintaining a sufficient gap-filling ability during the formation of the subsequently formed conductive feature. As a result, the contact resistance between the conductive feature 112 and the subsequently formed conductive feature can be reduced due to the increase of the contact area. Moreover, no void is formed in the subsequently formed conductive feature due to the maintenance of the gap-filling ability.

In some embodiments, the etching process 160 is designed to make sure that the conductive feature 112 has etching selectivity from the layers over the conductive feature 112 (e.g., the etching stop layer 114 and the insulating layer 116). As a result, damage or loss of those layers 114 and 116 can be prevented during the formation of the recess 162.

In some embodiments, the etching process 160 includes a dry etching process using a plasma source, such as a capacitively coupled plasma (CCP) source, an inductively coupled plasma (ICP) source, a radio frequency (RF) plasma source, or a microwave plasma source. As an example, the etching process 160 includes an ion beam etch (IBE) process that uses a process gas (which may include He, Ne, Ar, Kr, or Xe or a combination thereof) with an applied Ion beam etch (IBE) power at a range from about 100 W to about 2000 W and a beam angle in a range from about 0° to about 70°.

In some embodiments, the dry etching process includes an inductively coupled plasma-reactive ion etching (ICP-RIE) process that uses an organic gas as the process gas, such as CH3COOH, CH3OH, CH3CH2OH, or the like, or a combination thereof. The ICP-RIE process may be performed using an inductively-coupled plasma (ICP) power at a range from about 100 W to about 1500 W with a biased voltage in a range from about 0 V to about 300 V.

Alternatively, the process gas of the ICP-RIE process may include $CF_4$, $CHF_3$, $CH_3F$, $CH_2F_2$, $C_4F_8$, $C_4F_6$, $N_2$, $O_2$, Ar, or a combination thereof. In this case, the ICP-RIE process may be performed using an ICP power at a range from about 100 W to about 1500 W with a biased voltage in a range from about 0 V to about 500 V.

In some embodiments, the dry etching process includes an RIE process that uses a process gas including $Cl_2$, $SiCl_4$, $BCl_3$, $CF_4$, $CHF_3$, $CH_3F$, $CH_2F_2$, $C_4F_8$, $C_4F_6$, $N_2$, $O_2$ or Ar, or a combination thereof. The RIE process may be performed using an RF power at a range from about 100 W to about 2000 W with a biased voltage in a range from about 0 V to about 500 V.

In some embodiments, the etching process 160 includes a wet etching process using an etchant that includes chemical compounds in combination with corrosion inhibitors. In some embodiments, the wet etching process is performed at a temperature in a range from about 20° C. to about 100° C.

In some embodiments, those chemical compounds include tolunitrile, 4-methyl-3-nitrobenzonitrile, 4-(bromomethyl)benzonitrile, 4-(chloromethyl)benzonitrile, 2-fluoro-4-(trifluoromethyl)benzonitrile, 4-(trifluoromethyl)benzonitrile, diethylene glycol monobutyl ether, 2-(2-butoxyethoxy)ethyl acetate, diethylene glycol dimethyl ether, dimethyl sulfoxide, dimethylformamide, poly(ethylene glycol) bis(amine), (2-methylbutyl)amine, tris(2-ethylhexyl)amine, (4-isothiocyanatophenyl)(3-methylphenyl)amine, poly(ethylene glycol) methyl ether amine, poly(ethylene glycol) diamine, triethanolamine hydrochloride, triethanolamine, trolamine, trolamine salicylate, 2-chloroethyl vinyl ether, 2-[4-(dimethylamino)phenyl]ethanol, tetraethylethylenediamine, ammonium acetate, ammonium chloride, ammonium sulfate, ammonium formate, ammonium nitrate, ammonium carbonate, ammonium fluoride, ammonium persulphate, ammonium sulfamate, ammonium phosphate, or 1-acetylguanidine. In some embodiments, those corrosion inhibitors 1-hlorobenzotriazole, 5-chlorobenzotriazole, 5-methyl-1H-benzotriazole, 1-methyl-1H-1,2,3-benzotriazole-5-carbaldehyde, 1-methyl-1H-1,2,3-benzotriazol-5-amine, 1-methylimidazole, 2-mercapto-1-methylimidazole, 1-methylimidazole-2-sulfonyl chloride, 5-chloro-1-methylimidazole, 5-iodo-1-methylimidazole, thiamazole, 1-methylimidazolium chloride, 2,5-dibromo-1-methyl-1H-imidazole, 1H-benzotriazole-4-sulfonic acid, or benzotriazole (BTA)-like.

Figure 1G:
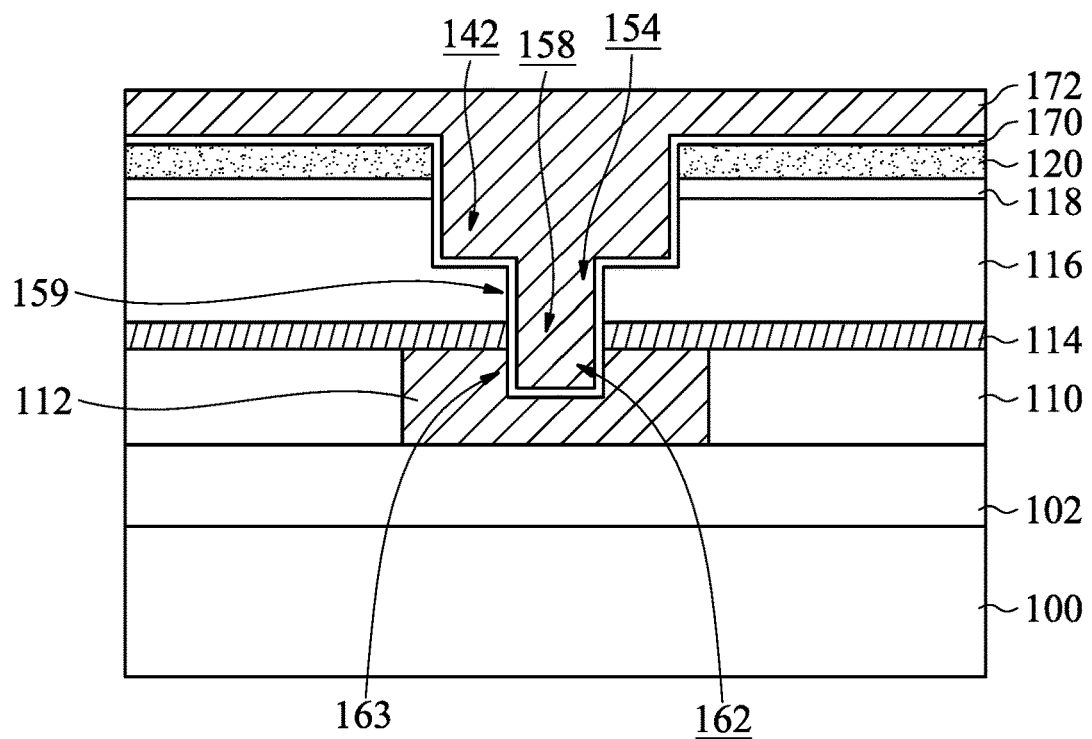

After the recess 162 is formed, a conformal barrier liner 170 and a fill metal material layer 172 are successively is formed over the middle layer 120 and fills the dual damascene opening (which includes the openings 142, 154 and 158 shown in FIG. 1F) and the recess 162, as shown in FIG. 1G in accordance with some embodiments. In some embodiments, the barrier liner 170 conformally covers the inner surface of the dual damascene opening and the recess 162, so as to be in direct contact with the middle layer 120, the bottom layer 118, the insulating layer 116, the etching stop layer 114, and the conductive feature 112.

In some embodiments, the barrier liner 170 is made of or includes Ta, TaN, Ti, TiN, W, WN, or a combination thereof. In some embodiments, the barrier liner 170 is formed using an ALD process, a PVD process, a CVD process, one or more other applicable processes, or a combination thereof.

In some embodiments, the fill metal material layer 172 and the barrier liner 170 are made of different materials. In some embodiments, the fill metal material layer 172 is made of or includes Cu, Co, Ni, Ru, W, Mo, Mn, Al, W, Ti, Ni, Au, Pt, one or more other suitable materials, or a combination thereof. In some embodiments, the fill metal material layer 172 is formed using an electroplating process, a PVD process, a CVD process, an electroless plating process, one or more other applicable processes, or a combination thereof. The fill metal material layer 172 may include a seed layer, which is not depicted in diagrams for the purpose of simplicity and clarity.

The barrier liner 170 with a sufficient thickness can protect the insulating layer 116 from diffusion of a metal material from the fill metal material layer 172 during subsequent thermal processes or cycles. The metal atoms from the barrier liner 170 can fix or strengthen the bonds between metal atoms (such as Cu or Al) in the fill metal material layer 172. Therefore, the fill metal material layer 172 can be prevented from breaking or peeling when the semiconductor device operates and current flows through the fill metal material layer 172.

Although the barrier liner 170 with a sufficient thickness can improve the reliability of the fill metal material layer 172, the contact resistance between the conductive feature 112 and the subsequently formed conductive feature (which includes the barrier liner 170 and the fill metal material layer 172) is increased when the thickness of the barrier liner 170 is increased. However, as mentioned, the recess 162 in the conductive feature 112 helps to increase the contact area between the conductive feature 112 and the subsequently formed conductive feature, so as to reduce the contact resistance. Therefore, the reliability of the subsequently formed conductive feature can be improved while reducing the contact resistance between the conductive feature 112 and the subsequently formed conductive feature.

Figure 1H:
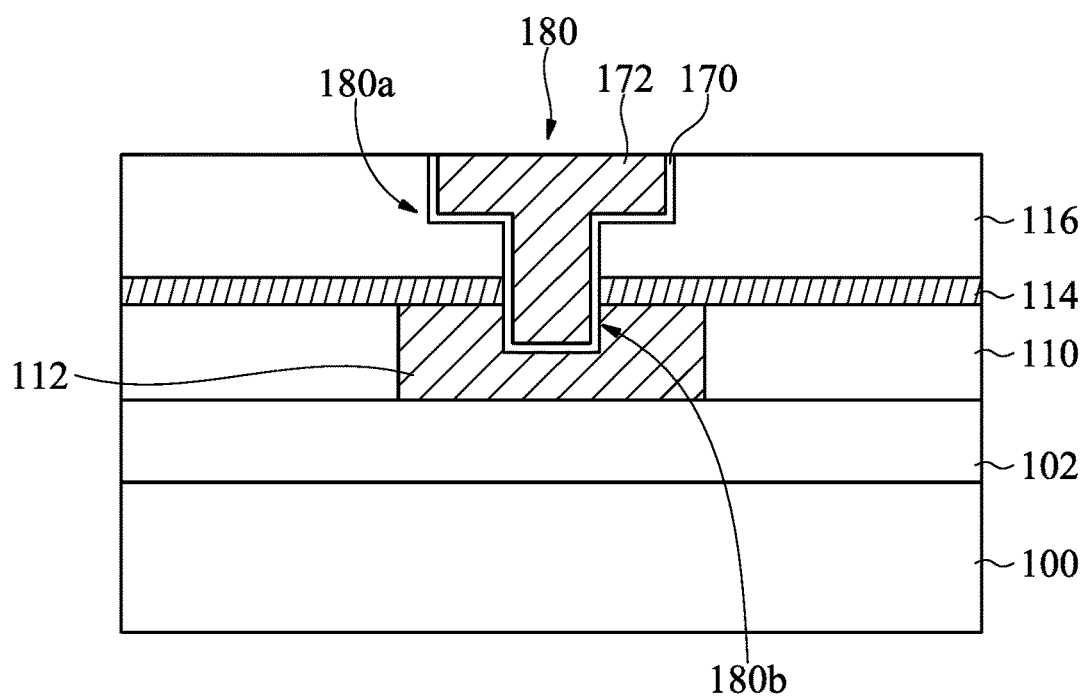

After the barrier liner 170 and the fill metal material layer 172 are formed, a planarization process is performed, as shown in FIG. 1H in accordance with some embodiments. The planarization process removes the barrier liner 170 and the fill metal material layer 172 above the insulating layer 116. The remaining portions of the barrier liner 170 and the fill metal material layer 172 in the dual damascene opening and the recess 162 form the conductive feature 180. The middle layer 120 and the bottom layer 118 are removed during the planarization process. As a result, the insulating layer 116 is exposed during and after the planarization process.

In some embodiments, the planarization process includes a chemical mechanical polishing (CMP) process. Alternatively, the planarization process includes a dry polishing process, a grinding process, an etching process, one or more other applicable processes, or a combination thereof.

The conductive feature 180 includes a first portion and a second portion. The combination of the first portion and the second portion of the conductive feature 180 may be referred to as an interconnection feature. The first portion is over the conductive feature 112 and surrounded by the insulating layer 116 and the etching stop layer 114. The second portion is formed in the recess 162 of the conductive feature 112, so as to be embedded in the conductive feature 112 with the depth D (as indicated in FIG. 1F). Therefore, the second portion of the conductive feature 180 has a thickness that is in a range from about 5% to about 30% of the thickness of the first conductive feature.

In some embodiments, the first portion of the conductive feature 180 that is surrounded by the etching stop layer 114 has a sidewall that is substantially aligned with a sidewall of the second portion of the conductive feature 180, as shown in FIG. 1H. In some embodiments, the first portion of the conductive feature 180 has a top width that is substantially the same as the trench width W1 (as indicated in FIG. 1C) and a bottom width that is substantially the same as the via bottom width W3 (as indicated in FIG. 1E) and less than the top width. Moreover, the second portion of the conductive feature 180 has a bottom width that is substantially the same as the bottom width of the first portion of the conductive feature and the recess width W4 (as indicated in FIG. 1F), as shown in FIG. 1H. In some other embodiments, the top width and the bottom width of the first portion of the conductive feature 180 may have substantially the same width. In those cases, the trench width W1 is substantially the same as the via bottom width W3.

Figures 1, 1H:
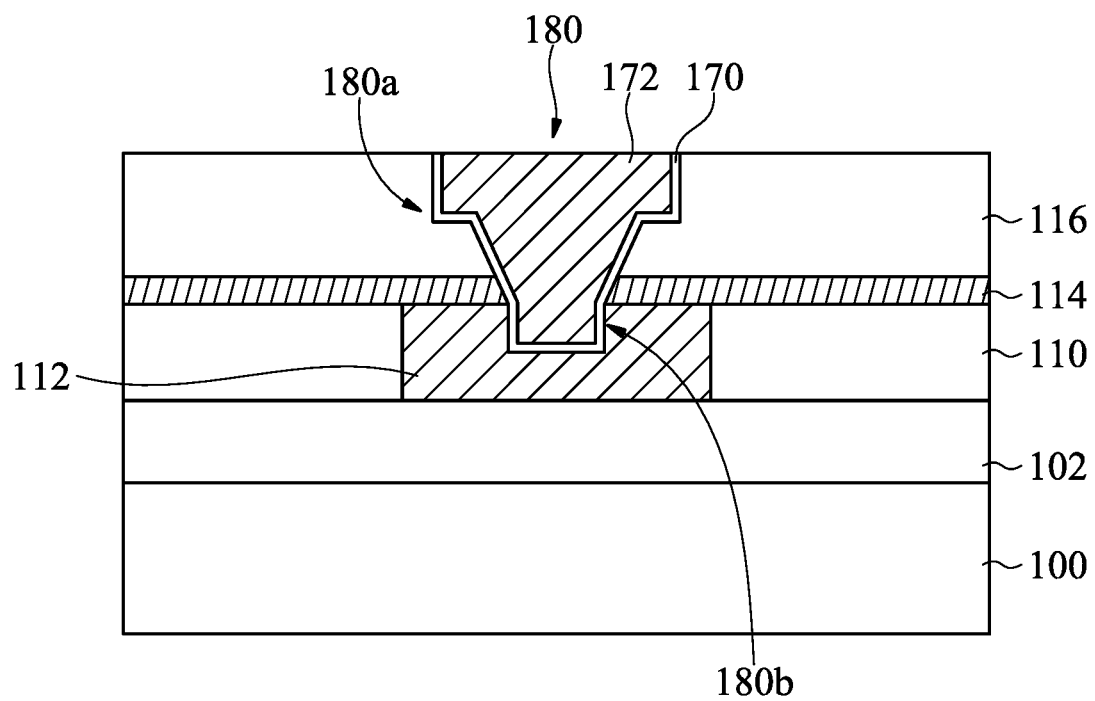

In some other embodiments, the via opening 154 shown in FIG. 1D and the extended via opening 158 shown in FIG. 1E have tapered sidewalls (not shown). Accordingly, the formed conductive feature 180 has tapered sidewalls corresponding to the via openings 154 and 158 (indicated in FIGS. 1D and 1E), as shown in FIG. 1H-1.

Although the barrier liner 170 of the conductive feature 180 that adjoins the conductive feature 112 may result in a raise of the contact resistance between the conductive features 180 and 112, the second portion of the conductive features 180 increases the contact area between the conductive features 180 and 112 so as to greatly reduce the contact resistance. Therefore, it can be ensured that the RC delay time is sufficiently low. Accordingly, the operation speed of the semiconductor device structure is increased.

In some embodiments, the steps described in FIGS. 1A to 1H may be referred to as dual damascene processes. Although FIGS. 1A to 1H show a trench-first process, embodiments of the disclosure may be applied to a via-first process. In some embodiments, the operations illustrated in FIGS. 1A to 1H are repeated one or more times to continue the formation of the interconnection structure(s).

Many variations and/or modifications can be made to embodiments of the disclosure. FIGS. 2A to 2G are cross-sectional views of various stages of a method of forming a semiconductor device structure, in accordance with some embodiments. The stages shown in FIGS. 2A to 2G are similar to those shown in FIGS. 1A to 1H. In some embodiments, the materials, formation methods, and/or benefits of the semiconductor device structure shown in FIGS. 1A to 1H can also be applied in the embodiments illustrated in FIGS. 2A to 2G, and are therefore not repeated.

Figure 2A:
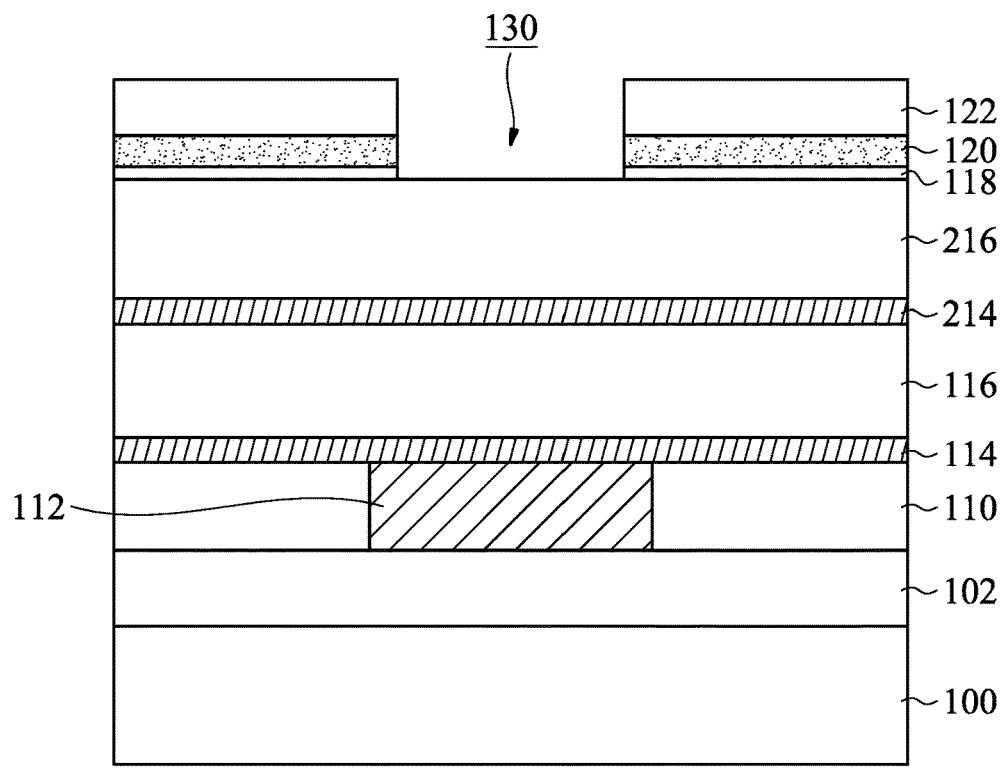
FIGS. 2A to 2G are cross-sectional views of various intermediate stages of a method of forming the semiconductor device structure in accordance with some embodiments.

A structure similar to FIG. 1B is provided, as shown in FIG. 2A in accordance with some embodiments. Unlike the structure shown in FIG. 1B, the structure shown in FIG. 2A further includes an etching stop layer 214 and an insulating layer 216 that are successively formed over the insulating layer 116 prior to the formation of the tri-layer resist structure including the bottom layer 118, the middle layer 120, and the top layer 122. Therefore, the opening 130 in the bottom layer 118 and the middle layer 120 partially exposes the insulating layer 216.

In some embodiments, the materials and/or formation methods of the etching stop layer 214 are the same as or similar to those of the etching stop layer 114. Moreover, the insulating layer 216 may serve as an IMD layer. The insulating layer 216 may be a single layer or a multi-layer structure including dielectric sub-layers. In some embodiments, the materials and/or formation methods of the insulating layer 216 are the same as or similar to those of the insulating layer 116.

Figure 2B:
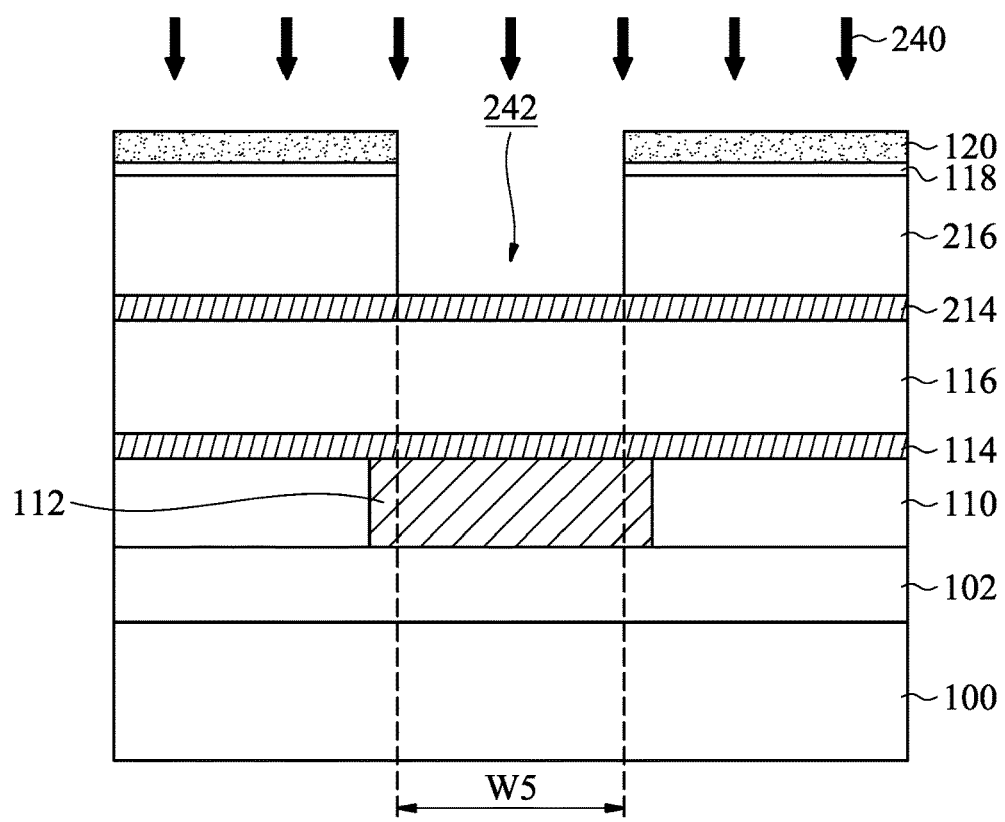

An etching process 240 is performed on the exposed insulating layer 216, as shown in FIG. 2B in accordance with some embodiments. As a result, the exposed insulating layer 216 is partially etched and patterned so that a trench opening 242 is formed to expose the etching stop layer 214. The etching process 240 may be the same as or similar to the etching process 140. Similarly, the top layer 122 may be removed or stripped before, during or after the etching process 240 for forming the trench opening 242.

In some embodiments, the trench opening 242 has substantially vertical sidewalls that define a trench width W5, as shown in FIG. 2B. In some other embodiments, the trench opening 242 has inclined sidewalls (not shown) that define a top trench width W5 (not shown).

Figure 2C:
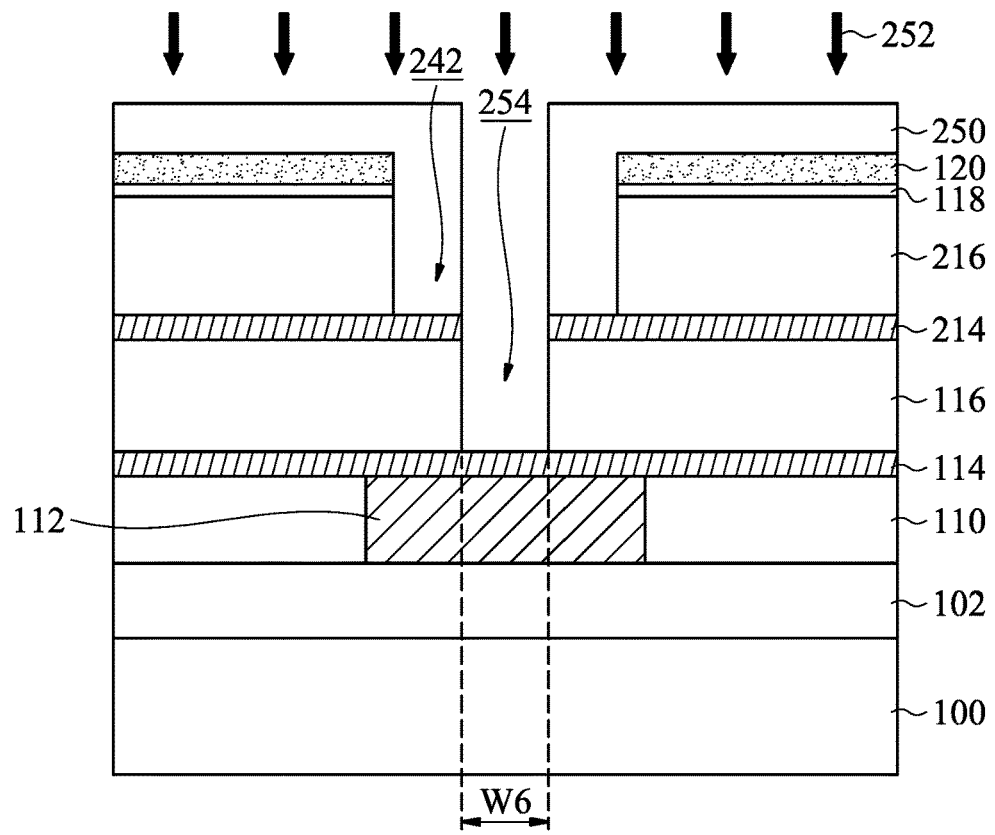

After the trench opening 142 is formed, a patterned masking layer 250 is formed over the middle layer 120 and fills in the trench opening 242, as shown in FIG. 2C in accordance with some embodiments. The patterned masking layer 250 exposes a portion of the etching stop layer 214 on the bottom of the trench opening 242 and defines a via pattern, which will subsequently be formed in the insulating layer 116 below the trench opening 242. The materials and/or formation methods of the masking layer 250 are the same as or similar to those of the masking layer 150 (shown in FIG. 1D).

Afterwards, one or more etching processes 252 are successively performed on the exposed etching stop layer 214 on the bottom of the trench opening 242 and the underlying insulating layer 116, as shown in FIG. 2C in accordance with some embodiments. The etching stop layer 214 and insulating layer 116 are etched and patterned so that a via opening 254 is formed and the etching stop layer 114 is exposed from the via opening 254. The etching process 252 may be a dry etching process or a wet etching process.

In some embodiments, the via opening 254 has substantially vertical sidewalls that define a via bottom width W6. The via bottom width W6 of the via opening 254 may be narrower than the width W5 of the trench opening 242.

The profile of the via opening 254 as viewed from a top-view perspective may be the same as or similar to that of the via opening 154 (shown in FIG. 1D). In some other embodiments, the via opening 254 has inclined sidewalls (not shown) that define a top via bottom width W6 (not shown) and a bottom via bottom width (not shown) that is narrower than the top via bottom width W6.

Figure 2D:
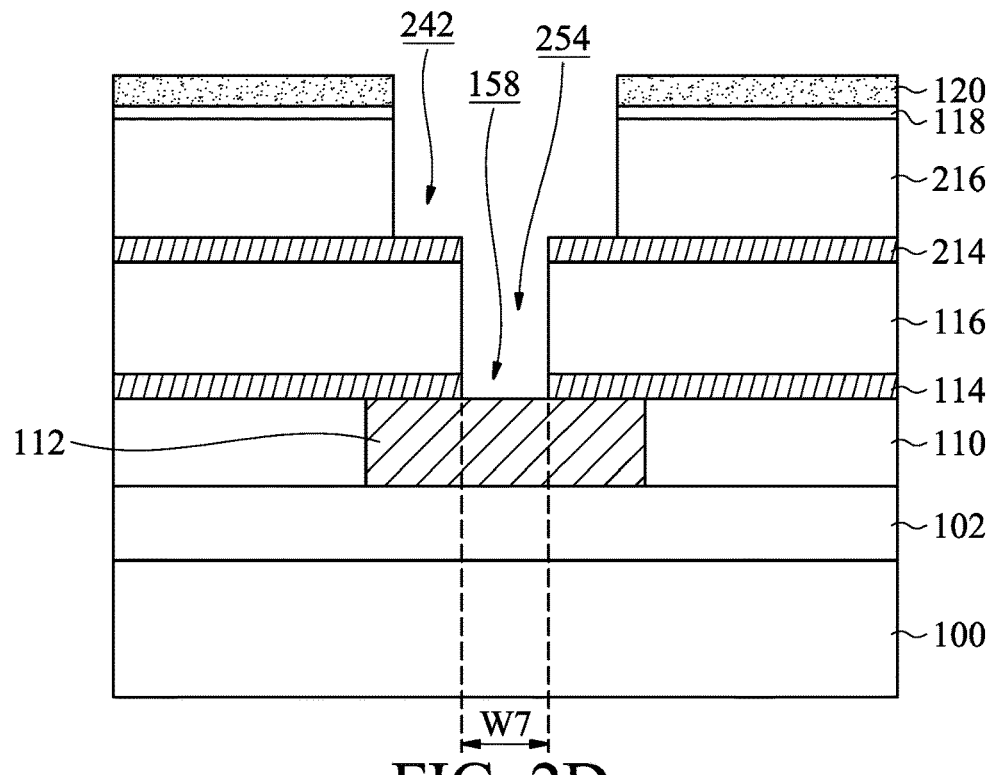

Similarly, the masking layer 250 is removed or stripped after the via opening 254 is formed. Afterwards, an extended via opening 158 is formed in the etching stop layer 140, as shown in FIG. 2D in accordance with some embodiments. The extended via opening 158 may be formed by the method shown in FIG. 1E, so that the conductive feature 112 is exposed from the extended via opening 158, the via opening 254 and the trench opening 242 (which form a dual damascene opening), as shown in FIG. 2D.

Similarly, the extended via opening 158 has substantially vertical sidewalls that define a via bottom width W7 that may be substantially the same as the via bottom width W3 (shown in FIG. 1E). Moreover, the vertical sidewalls of the extended via opening 158 may be substantially aligned with the corresponding vertical sidewalls of the via opening 254. The via opening 254 and the extended via opening 158 may have substantially the same widths. For example, the via bottom width W6 of the via opening 254 may be substantially the same as the via bottom width W7 of the extended via opening 158.

Figure 2E:
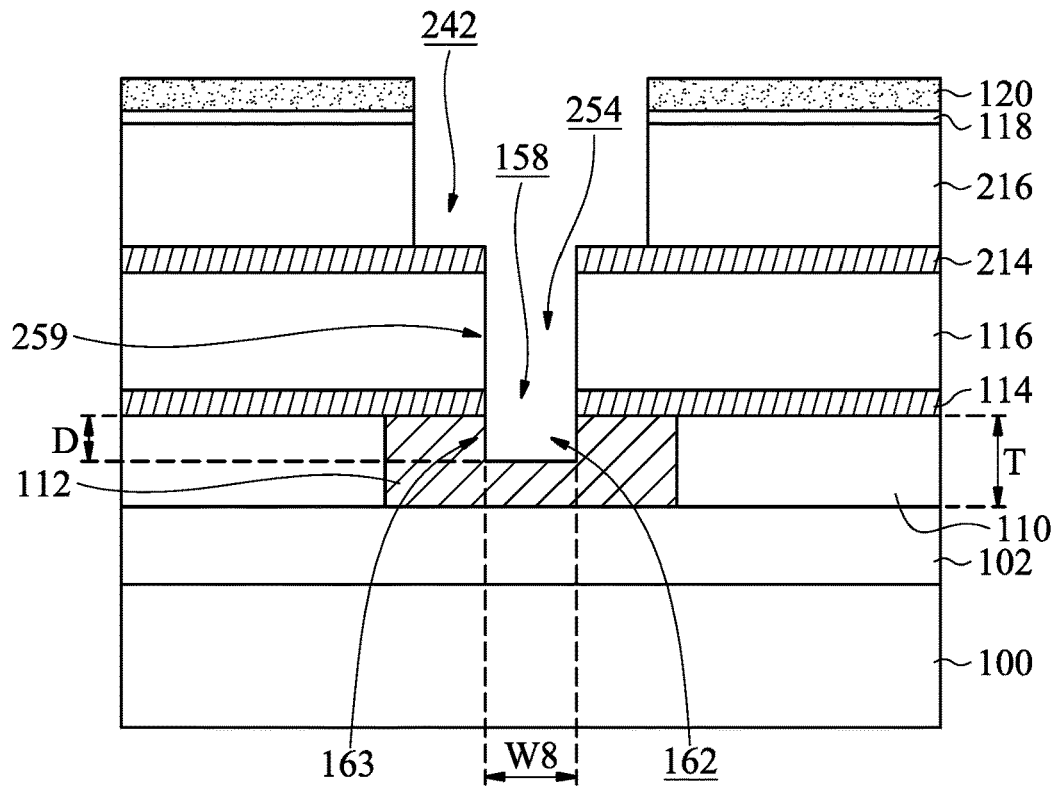

Afterwards, the exposed conductive feature 112 is recessed, as shown in FIG. 2E in accordance with some embodiments. A recess (or opening) 162 may be formed in the conductive feature 112 by the method shown in FIG. 1F. In some embodiments, the recess 162 has substantially vertical sidewalls 163 that define a recess width W8. Moreover, the vertical sidewalls 163 of the recess 162 are substantially aligned with the corresponding vertical sidewalls 259 of the via opening 254 and the extended via opening 158, as shown in FIG. 2E. As a result, the recess 162 and the extended via opening 158 have substantially the same widths.

As mentioned above, the depth D of the recess 162 is in a range from about 10 Å to about 50 Å. Moreover, the depth D is in a range from about 5% to about 30% of a thickness T of the conductive feature 112.

Figure 2F:
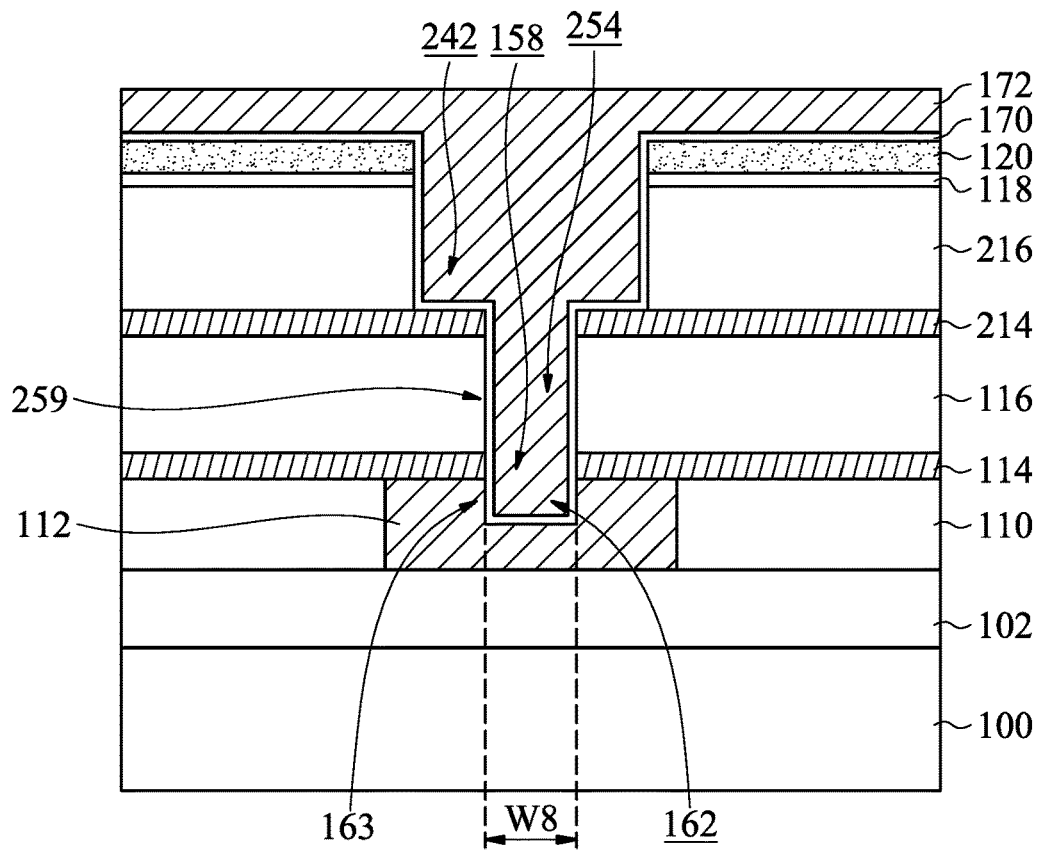

Afterwards, a conformal barrier liner 170 and a fill metal material layer 172 are successively is formed over the middle layer 120 and fills the dual damascene opening (which includes the openings 242, 254 and 158 shown in FIG. 2E) and the recess 162, as shown in FIG. 2F in accordance with some embodiments. The barrier liner 170 and the fill metal material layer 172 may be formed by the method shown in FIG. 1G.

Figure 2G:
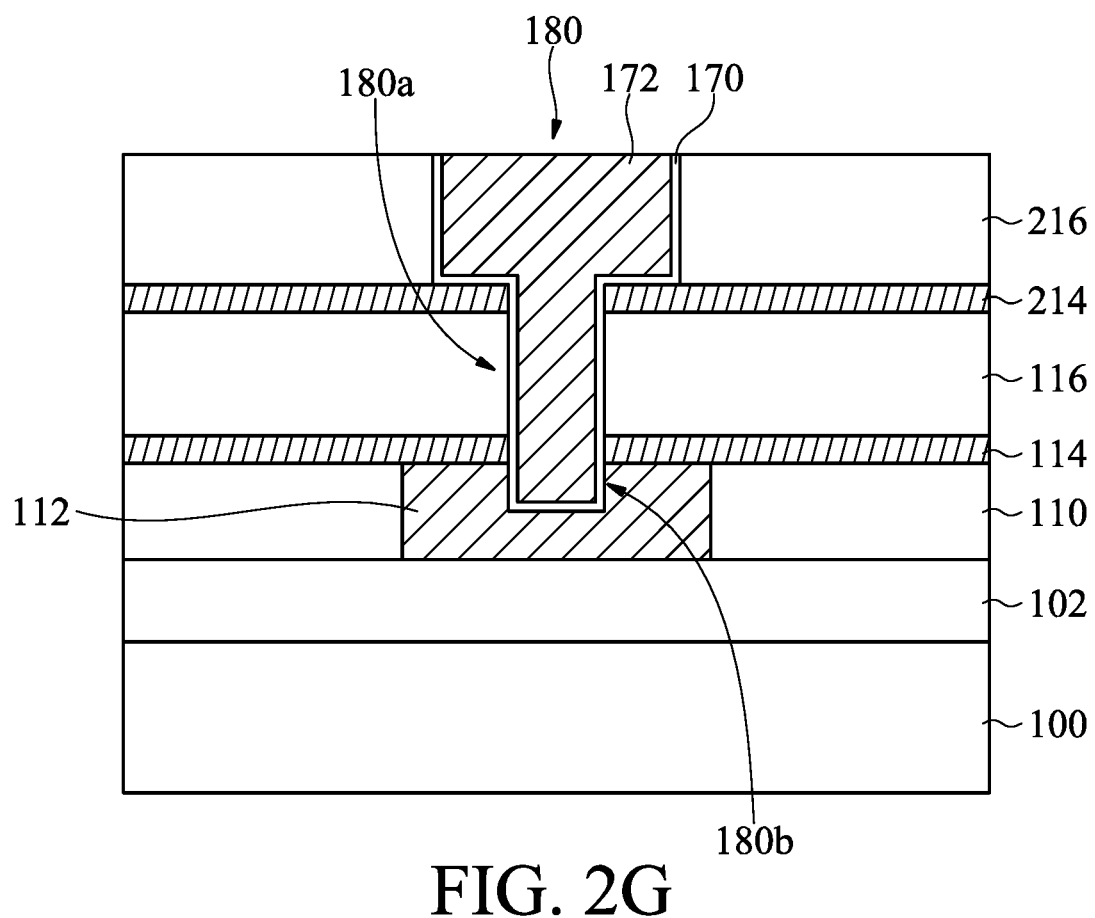

Afterwards, a planarization process is performed to form a conductive feature 180 in the dual damascene opening and the recess 162, as shown in FIG. 2G in accordance with some embodiments. The planarization process removes the barrier liner 170 and the fill metal material layer 172 above the insulating layer 216 so as to form the conductive feature 180. The middle layer 120 and the bottom layer 118 are removed during the planarization process. In some embodiments, the planarization process includes a CMP process. Alternatively, the planarization process includes a dry polishing process, a grinding process, an etching process, one or more other applicable processes, or a combination thereof.

In some embodiments, the steps described in FIGS. 2A to 2G may be referred to as dual damascene processes. Although FIGS. 2A to 2G show a trench-first process, embodiments of the disclosure may be applied to a via-first process. In some embodiments, the operations illustrated in FIGS. 2A to 2G are repeated one or more times to continue the formation of the interconnection structure(s).

Embodiments of a semiconductor device structure and a method for forming the same are provided. The semiconductor device structure includes a first conductive feature formed over a substrate and covered by an insulating layer. A first opening is formed in the insulating layer to expose the first conductive feature. Afterwards, the exposed first conductive feature is recessed, so as to form a second opening (e.g., a recess) in the first conductive feature. The second opening can be formed using a dry etching process or a wet etching process. A second conductive feature formed over and partially embedded in the first conductive feature via the first and second openings. As a result, the contact resistance between the first and second conductive features is reduced because the second opening increases the contact area between the first and second conductive features. Since the contact resistance can be reduced, there is not necessary to reduce the thickness of barrier liner of the second conductive feature, thereby insuring reliability for time-dependent dielectric breakdown (TDDB).

In some embodiments, a method for forming a semiconductor device structure is provided. The method includes forming a first conductive feature over a substrate. The method also includes forming an insulating layer over the substrate and covering the first conductive feature. The method also includes forming a first opening in the insulating layer to expose the first conductive feature. The method also includes recessing the exposed first conductive feature through the first opening, so as to form a second opening in the first conductive feature and below the first opening. The method also includes filling the first opening and the second opening with a second conductive feature.

In some embodiments, a method for forming a semiconductor device structure is provided. The method includes forming a conductive feature in a first insulating layer. The method also includes forming an etching stop layer over the first insulating layer and covering the conductive feature. The method also includes forming a second insulating layer over the etching stop layer. The method also includes forming a first opening in the second insulating layer over the conductive feature, so as to expose the etching stop layer. The method also includes forming a second opening in the etching stop layer and below the first opening, so as to expose the conductive feature. The method also includes recessing the expose the conductive feature to form a recess in the conductive feature. The method also includes successively forming a barrier liner and a fill metal material layer in the first opening, the second opening, and the recess.

In some embodiments, a semiconductor device structure is provided. The semiconductor device structure includes a first conductive feature over a substrate. The semiconductor device structure also includes a second conductive feature includes a first portion over the first conductive feature and a second portion embedded in the first conductive feature with a depth. The depth is in a range from about 5% to about 30% of the thickness of the first conductive feature. The semiconductor device structure also includes a first insulating layer over the substrate and surrounding the first portion of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first conductive feature over a substrate;
    forming an insulating layer over the substrate and covering the first conductive feature;
    forming a first opening in the insulating layer to expose the first conductive feature;
    recessing the exposed first conductive feature through the first opening, so as to form a second opening in the first conductive feature and below the first opening; and
    filling the first opening and the second opening with a second conductive feature,
    wherein a bottom width of the first opening is substantially the same as a bottom width of the second opening and wherein the second conductive feature comprises a fill metal material layer and a barrier liner between the fill metal material layer and the first and second openings, so that a bottom surface of the fill metal material layer is covered by the barrier liner.

2. The method as claimed in claim 1, wherein the exposed first conductive feature is recessed by performing a dry etching process.

3. The method as claimed in claim 2, wherein the dry etching process is performed using a plasma source that comprises a capacitively coupled plasma source, an inductively coupled plasma source, a radio frequency plasma source, or a microwave plasma source.

4. The method as claimed in claim 1, wherein the exposed first conductive feature is recessed by performing a wet etching process.

5. The method as claimed in claim 4, wherein the wet etching process uses an etchant that comprises chemical compounds in combination with corrosion inhibitors.

6. The method as claimed in claim 1, wherein a top width of the first opening is greater than the bottom width of the first opening.

7. The method as claimed in claim 1, wherein the second opening has a depth that is in a range from about 5% to about 30% of a thickness of the first conductive feature.

8. The method as claimed in claim 1, further comprising:
    forming a second insulating layer with a third opening over the insulating layer prior to formation of the first opening,
    wherein the first opening is below the third opening and has tapered sidewalls, and wherein the fill metal material layer and the barrier liner are made of different materials.

9. A method for forming a semiconductor device structure, comprising:
    forming a conductive feature in a first insulating layer;
    forming an etching stop layer over the first insulating layer and covering the conductive feature;
    forming a second insulating layer over the etching stop layer;
    forming a first opening in the second insulating layer over the conductive feature, so as to expose the etching stop layer;
    forming a second opening with tapered sidewalls in the etching stop layer and below the first opening, so as to expose the conductive feature;
    recessing the exposed conductive feature to form a recess with substantially vertical sidewalls in the conductive feature; and
    successively forming a barrier liner and a fill metal material layer in the first opening, the second opening, and the recess.

10. The method as claimed in claim 9, wherein the recess has a depth that is in a range from about 5% to about 30% of a thickness of the conductive feature.

11. The method as claimed in claim 9, wherein tops of the substantially vertical sidewalls of the recess and bottoms of the tapered sidewalls of the second opening are adjoined each other.

12. The method as claimed in claim 9, wherein the exposed conductive feature is recessed using a dry etching process or a wet etching process.

13. The method as claimed in claim 9, wherein the formation of the first opening comprises:
    etching the second insulating layer to form a trench opening in the second insulating layer; and
    etching a bottom of the trench opening to form a via opening in the second insulating layer.

14. The method as claimed in claim 9, wherein the conductive feature is a metal layer that is made of Cu, Co, Ni, Ru, W, Mo, or Mn.

15. The method as claimed in claim 9, wherein a lower portion of the first opening has tapered sidewalls.

16. A method for forming a semiconductor device structure, comprising:
    forming a conductive feature in a first insulating layer;
    successively forming a first etching stop layer, a second insulting layer, a second etching stop layer, and a third insulating layer over the first insulating layer and covering the conductive feature;
    forming a first opening in the third insulating layer over the conductive feature, so as to expose the second etching stop layer;
    forming a second opening in the second etching stop layer and the second insulating layer over the conductive feature, so as to expose the first etching stop layer;
    forming a third opening in the first etching stop layer and below the second opening, so as to expose the conductive feature;

recessing the exposed conductive feature to form a recess in the conductive feature;

forming a conformal barrier liner covering a bottom and sidewalls of the recess; and forming a fill metal material layer in the first opening, the second opening, the third opening, and the recess to cover the barrier liner, wherein the fill metal material layer and the barrier liner are made of different materials.

17. The method as claimed in claim 16, the recess has a depth that is in a range from about 5% to about 30% of a thickness of the conductive feature and formed by using a dry etching process or a wet etching process.

18. The method as claimed in claim 16, wherein the second opening has sidewalls that are substantially aligned with sidewalls of the third opening and the sidewalls of the recess.

19. The method as claimed in claim 18 wherein the first opening has a width greater than a width of the second opening, and wherein the width of the second opening is substantially the same as a width of the third opening and a width of the recess.

20. The method as claimed in claim 16, further comprising forming the barrier liner in the first opening, the second opening, and the third opening prior to the formation of the fill metal material layer.

* * * * *